United States Patent
Murphy

(10) Patent No.: US 7,847,690 B2
(45) Date of Patent: Dec. 7, 2010

(54) SYSTEM AND METHOD FOR DETECTING TAMPERING OF A UTILITY METER

(75) Inventor: Michael A. Murphy, Raleigh, NC (US)

(73) Assignee: Elster Electricity LLC, Raleigh, NC (US)

(*) Notice: Subject to any disclaimer, the term of this patent is extended or adjusted under 35 U.S.C. 154(b) by 306 days.

(21) Appl. No.: 12/080,056

(22) Filed: Mar. 31, 2008

(65) Prior Publication Data

US 2009/0243866 A1    Oct. 1, 2009

Related U.S. Application Data

(60) Provisional application No. 61/009,096, filed on Dec. 26, 2007.

(51) Int. Cl.
*G08B 13/08* (2006.01)
*G08B 13/14* (2006.01)
*G01R 11/56* (2006.01)
*G01R 21/133* (2006.01)
*G06F 17/00* (2006.01)

(52) U.S. Cl. .................. 340/545.4; 340/568.1; 705/412

(58) Field of Classification Search ............ 340/870.02, 340/635–636.9, 693.5, 693.6, 3.1, 3.3, 500–506, 340/636.15, 636.12, 540, 541, 545.6, 565, 340/566, 568.1, 568.8; 705/412
See application file for complete search history.

(56) References Cited

U.S. PATENT DOCUMENTS

| | | | | |
|---|---|---|---|---|
| 4,072,051 A * | 2/1978 | Peterson | .................. | 73/861.03 |
| 4,337,466 A * | 6/1982 | Spahn | .................. | 340/870.09 |
| 4,571,691 A * | 2/1986 | Kennon | .................. | 340/545.3 |
| 5,140,258 A * | 8/1992 | Bishop | .................. | 324/110 |
| 5,473,322 A * | 12/1995 | Carney | .................. | 340/870.02 |
| 5,523,559 A * | 6/1996 | Swanson | .................. | 250/222.1 |
| 6,232,886 B1 * | 5/2001 | Morand | .................. | 340/870.02 |
| 6,362,745 B1 * | 3/2002 | Davis | .................. | 340/637 |
| 6,774,807 B1 * | 8/2004 | Lehfeldt et al. | .................. | 340/686.1 |
| 6,852,935 B2 * | 2/2005 | Higgins et al. | .................. | 200/61.52 |
| 7,432,823 B2 * | 10/2008 | Soni | .................. | 340/870.02 |
| 7,495,578 B2 * | 2/2009 | Borleske | .................. | 340/870.02 |
| 2005/0258974 A1 * | 11/2005 | Mahowald | .................. | 340/632 |

* cited by examiner

*Primary Examiner*—Jennifer Mehmood
(74) *Attorney, Agent, or Firm*—Woodcock Washburn LLP

(57) ABSTRACT

A tamper alarm circuit for detecting a tampered condition of a utility meter is disclosed. The tamper alarm circuit has a transducer coupled to an amplification circuit which is coupled to a detection circuit, the detection circuit generating an alarm condition when the detection circuit determines that a voltage signal generated by the transducer and amplified by the amplification circuit has reached a predetermined threshold.

23 Claims, 6 Drawing Sheets

SYSTEM AND METHOD FOR DETECTING TAMPERING OF A UTILITY METER

CROSS-REFERENCE TO RELATED APPLICATIONS

This application claims the benefit under 35 U.S.C. 119(e) of U.S. provisional patent application No. 61/009,096, filed Dec. 26, 2007.

FIELD OF INVENTION

The present invention relates generally to power systems, and more particularly to a method and apparatus for detecting possible tampering with a utility meter.

RELEVANT BACKGROUND

Utility companies use utility meters to regulate and monitor utility usage. Some exemplary utility meters include electrical power meters (also referred to in the industry as watt-hour meters), water meters, gas meters and the like. Early utility meters were mechanical in nature converting the flow of the particular utility resource through the utility meter into mechanical movement. The mechanical movement was used to turn a recording device which recorded the amount of resources being used. As technology improved over the years, the design of the utility meter incorporated new innovations such as increased processing capability within the utility meter, elimination of mechanical parts, better accuracy and the like.

One problem utility companies continue to deal with since the advent of the utility meter is the tampering consumer. The tampering consumer may be an individual who desires to alter the monitoring capabilities of the utility meter. By altering the monitoring capabilities of the utility meter, the tampering consumer may receive some or all of the utility resources at a significantly discounted rate. This presents a problem not only with the theft of the utility resource but also with the potential safety hazard that may be caused by the tampering consumer. The potential safety hazard may in turn affect other utility consumers connected to the power grid.

Previous utility meters may have had some means of detecting tampering with the utility meter. Commonly, a sensor may have been configured in previous utility meters to monitor the cover of the utility meter. Thus, when a tampering consumer opened the utility meter cover, an alarm condition may have been generated by circuitry within the utility meter. The alarm condition may then be reported in various ways to the utility company. Depending on the number of alarms, the frequency of the alarms and the like, the utility company may take any remedial action it deemed necessary in order to confirm and remedy the tampered condition.

Other means have been used in previous utility meters to detect tampering. Another example of previous ways to detect tampering with a utility meter was to employ a movable and conductive metal ball contained within a metal housing. The metal ball was positioned to move from a resting position to an alarm position if the utility meter was physically moved. If the utility meter moved in a certain direction, the ball would roll from the resting position to an alarm position which may be on the opposite side of the metal housing. When the ball transitioned from the resting position to the alarm position, the metal housing became conductive and the utility meter then detected the conductive change. After the utility meter detected the conductive change, the utility meter raised an alarm condition alerting the utility company of the potential tampered condition.

The previous method of detecting tampering using a mechanically moving conductive ball may not detect to certain types of movement of the utility meter. The utility meter may be moved in such a way as not to activate the mechanically moving conductive ball tampering detection circuitry. In addition, this type of detection circuitry may be costly to deploy within the utility meter. In some cases, this type of detection circuitry may not be mounted using surface mount technology and may have to be hand soldered within the utility meter. To more effectively detect possible utility meter tampering at a much lower cost, the present invention utilizes the piezoelectric properties of a ceramic capacitor to detect movement of the meter. Circuitry associated with the present invention located within the utility meter monitors and detects when the ceramic capacitor experiences any mechanical strain, and provides a way for the utility meter to signal the utility company of possible meter tampering.

SUMMARY

Accordingly, there exists a need in the industry to have a utility metering system that can detect possible meter tampering under certain conditions by detecting physical movement of the meter. By detecting movement of the meter under certain conditions, the utility meter may be able to identify possible meter tampering and notify the utility company accordingly. The present disclosure recognizes this need and discloses such a device.

A tamper alarm circuit for detecting a tampered condition of a utility meter is disclosed. The tamper alarm circuit has a transducer coupled to an amplification circuit which is coupled to a detection circuit, the detection circuit generating an alarm condition when the detection circuit determines that a voltage signal generated by the transducer and amplified by the amplification circuit has reached a predetermined threshold.

A utility meter is disclosed. The utility meter having a utility resource monitoring circuit, the utility resource monitoring circuit monitoring the amount of resources used by a consumer. The utility resource monitoring circuit communicates with a tamper alarm circuit, the tamper alarm circuit having a transducer coupled to an amplification circuit which is coupled to a detection circuit. The detection circuit generating an alarm condition when the detection circuit determines that a voltage signal generated by the transducer and amplified by the amplification circuit has reached a predetermined threshold.

A method for detecting a tamper condition in a utility meter is disclosed. The method provides a transducer which is coupled to an amplification circuit which is coupled to a detection circuit. The method determines that a voltage signal generated by the transducer and amplified by the amplification circuit has reached a predetermined threshold. The method further generates an alarm condition when the detection circuit determines that the amplified voltage signal has reached the predetermined threshold.

A more complete understanding of the present invention, as well as further features and advantages of the invention, will be apparent from the following detailed description and the accompanying drawings.

DETAILED DESCRIPTION

The detailed description set forth below in connection with the appended drawings is intended as a description of various embodiments of the present invention and is not intended to represent the only embodiments in which the present invention may be practiced. The detailed description includes specific details for the purpose of providing a thorough understanding of the present invention. However, it will be apparent to those skilled in the art that the present invention may be practiced without these specific details. In some instances, well-known structures and components are shown in block diagram form in order to avoid obscuring the concepts of the present invention. Acronyms and other descriptive terminology may be used merely for convenience and clarity and are not intended to limit the scope of the invention FIG. 1 displays a high level view of a utility metering device 100 utilizing one embodiment of the present invention. The utility metering device 100 is designed to receive a utility resource at a source side 160 of the utility metering device 100. In one embodiment, the utility resource may be electrical power provided from the utility power grid, typically from a transformer near the consumer site. The utility resource received is monitored by a utility resource monitor 120. The utility resource monitor circuit 120 monitors the flow of utility resources through the utility metering device 100 to the consumer.

Figure 1:
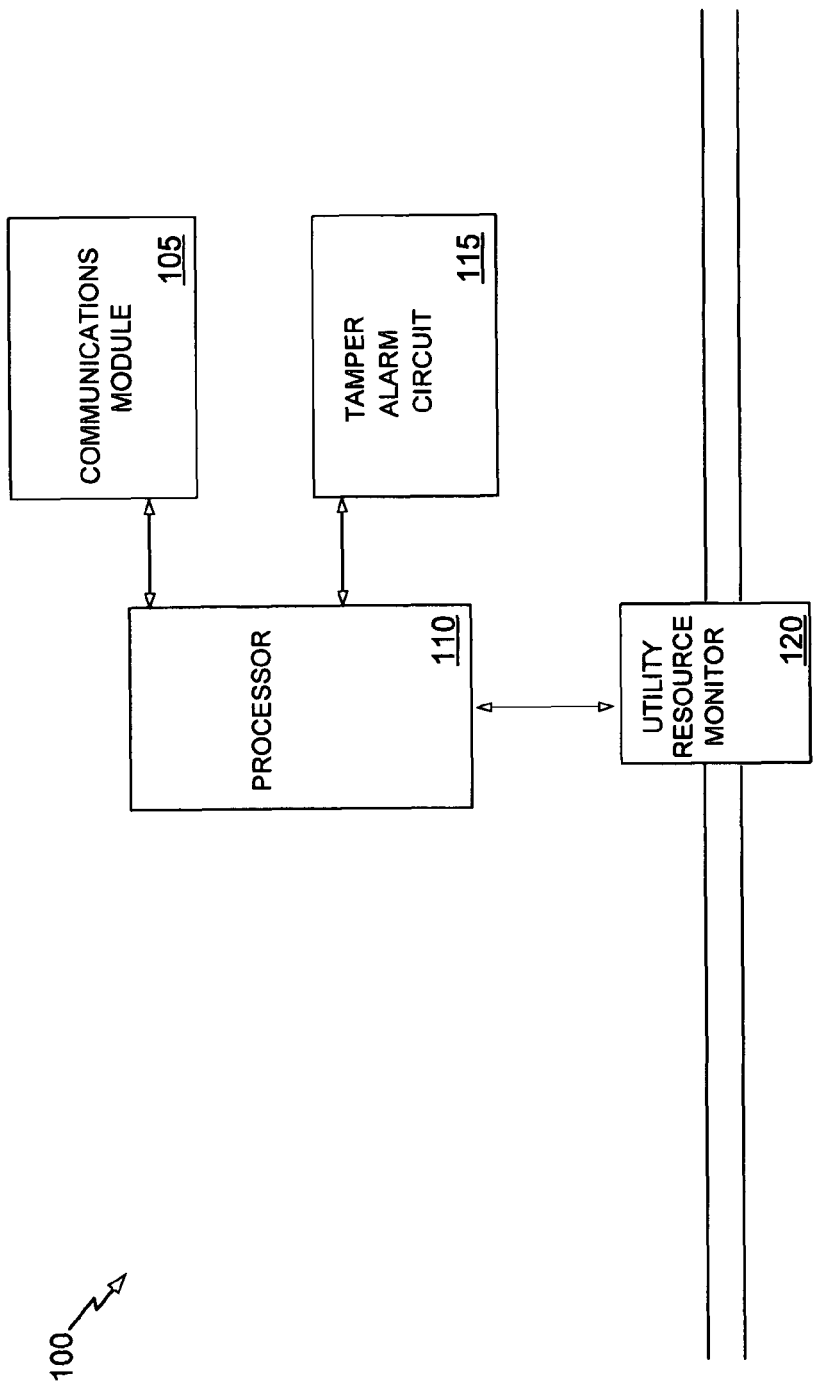
FIG. 1 shows a high level logic hardware block diagram of a utility metering device using one embodiment of the present invention.

As is displayed in FIG. 1, the utility metering device 100 may have a processor 110 which communicates with the utility resource monitor circuit 120 to determine the status and amount of the utility resources being used by the consumer. The utility resource information may be communicated to the utility company via a communications module 105 which is coupled to the processor 110. In one embodiment, the communications module 105 may utilize two way radio communications to relay the utility usage information. In another embodiment, the communications module 105 may utilize wireless communications to communicate within the utility monitoring network. In yet another alternative embodiment, the communications module 105 may use cellular radio communications to communicate with the utility company.

Also coupled to the processor 110 is a tamper alarm circuit 115. The tamper alarm circuit 115 may monitor the conditions at the utility meter 100 and when it detects a possible tampering condition, it notifies the processor 110 by raising a tampering condition alarm. After the processor 110 receives the possible tampering condition alarm from the tamper alarm circuit 115, the processor 110 may in turn notify the utility company. After the tampering alarm condition is raised, the processor 110 may continue to receive information from the tamper alarm circuit 115 to determine if the tampering condition alarm is a one time event or is a continuous event.

Figure 2:
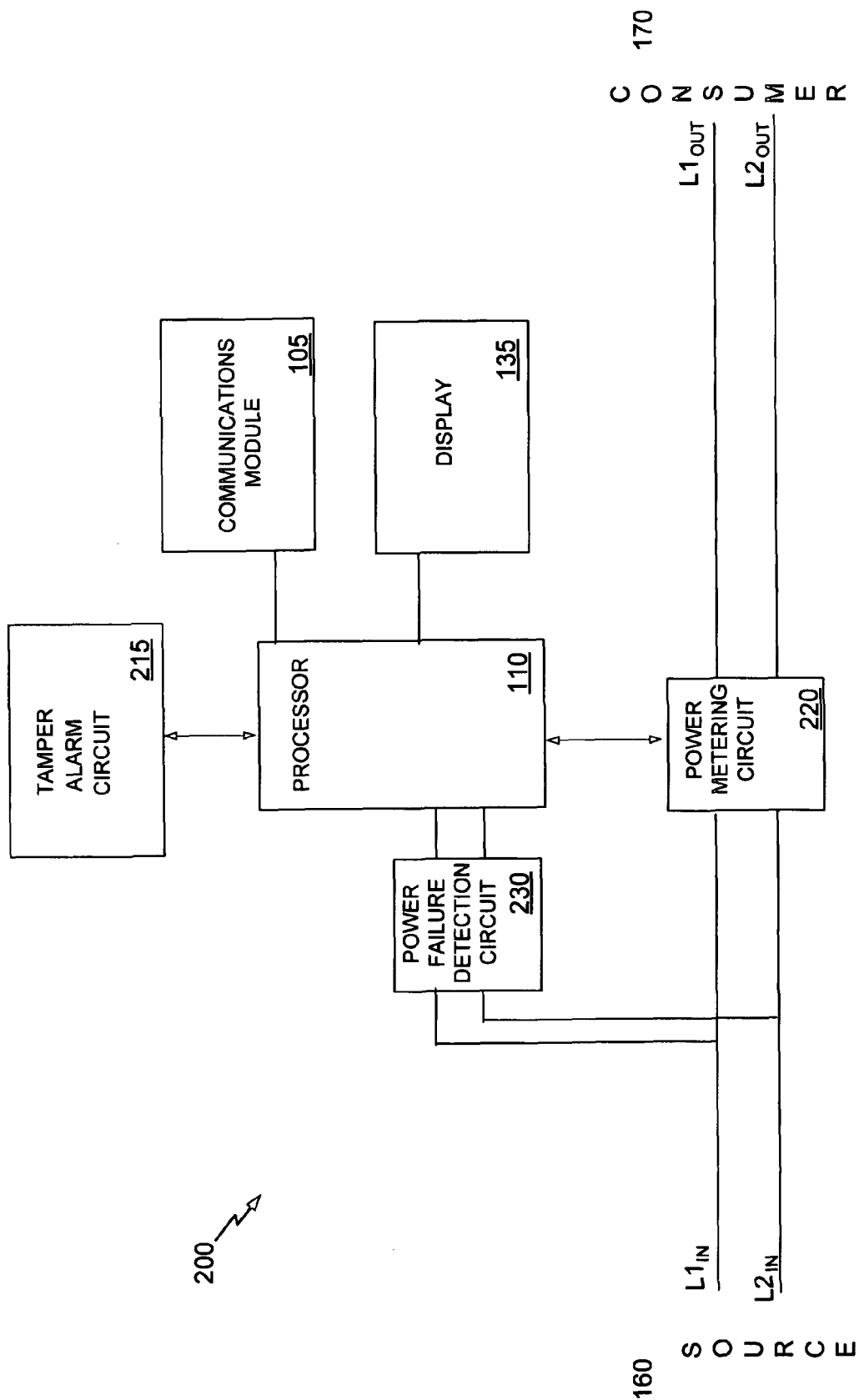
FIG. 2 shows a high level logic hardware block diagram of a power metering device using one embodiment of the present invention.

FIG. 2 displays an electrical watt-hour meter 200 in accordance with another embodiment of the present invention. The watt-hour meter 200 is designed to monitor a source line voltage at $L1_{IN}$ and $L2_{IN}$ at its source side 160. The source voltage present at the source side 160 of the watt-hour meter 200 is typically one of the common electric utility service voltages and generally a maximum of 480 VAC. The watt-hour meter 200 routes the electrical energy from the source side 160 to the consumer side contacts $L1_{out}$ and $L2_{out}$ of the watt-hour meter 200. Also connected to the source side 160 of the watt-hour meter 200 is a power failure detection circuit 230 and a display 135. The display 135 provides a visual display of the amount of energy used at the customer location. The power failure detection circuit 230 monitors the voltage present at the source side voltage contacts $L1_{IN}$ and $L2_{IN}$. In the event of a power failure, the power failure detection circuit 230 communicates this condition to the processor 110. The watt-hour meter 200 has a power metering circuit 220 which measures the amount of energy being used by the consumer.

The watt-hour meter 200 has a communications module 105 which allows the utility company to communicate with and gather information from the watt-hour meter 200. In one exemplary embodiment, the communications module 105 may utilize cellular telephone technology to communicate with the utility company service center or craftsperson. In this embodiment, the craftsperson may use portable computer with a cellular telephone to connect with the meter to retrieve status or other useful information from the watt-hour meter 200. In an alternative embodiment, the communications module 105 may support other types of wireless communications. In yet another alternative embodiment, the watt-hour metering device 100 may be connected to a cable modem which in turn may be attached to the consumer's cable line. In this example, the utility company may connect to the watt-hour meter 200 using TCP/IP or other networking protocols.

The watt-hour meter 200 has a tamper alarm circuit 215 which is coupled to the processor 110. As is explained in greater detail in the discussion of FIGS. 3-4, the tamper alarm circuit 215 monitors the conditions at the watt-hour meter 200 and determines if a tamper condition exists. If a tamper condition exists, the tamper alarm circuit 215 may send a tampering alarm to the processor 110 which in turn may assess the conditions at the watt-hour meter 200 to determine if the possible tampering condition warrants notification of the utility company. In one embodiment of the present invention, the tamper alarm circuit 215 may determine that a tampering alarm should be raised and reported to the utility company when physical movement of the watt-hour meter 200 is detected just prior to a power failure.

One such tampering condition may occur when the watt-hour meter 200 is removed from service by physically pulling the watt-hour meter 200 away from the source side contacts $L1_{in}$ and $L2_{in}$ and the consumer side contacts $L1_{out}$ and $L2_{out}$. In this example, the watt-hour meter 200 may be removed by an unauthorized person in order to access the internal components in an attempt to either bypass the monitoring sensors or disable them. In one exemplary embodiment, the tamper alarm circuit 215 may detect this tampering condition and generate the tampering condition alarm to the processor 110. The processor 110 in turn may receive the tampering condition alarm and report the tampering to the utility company via the communication module 105.

Figure 3:
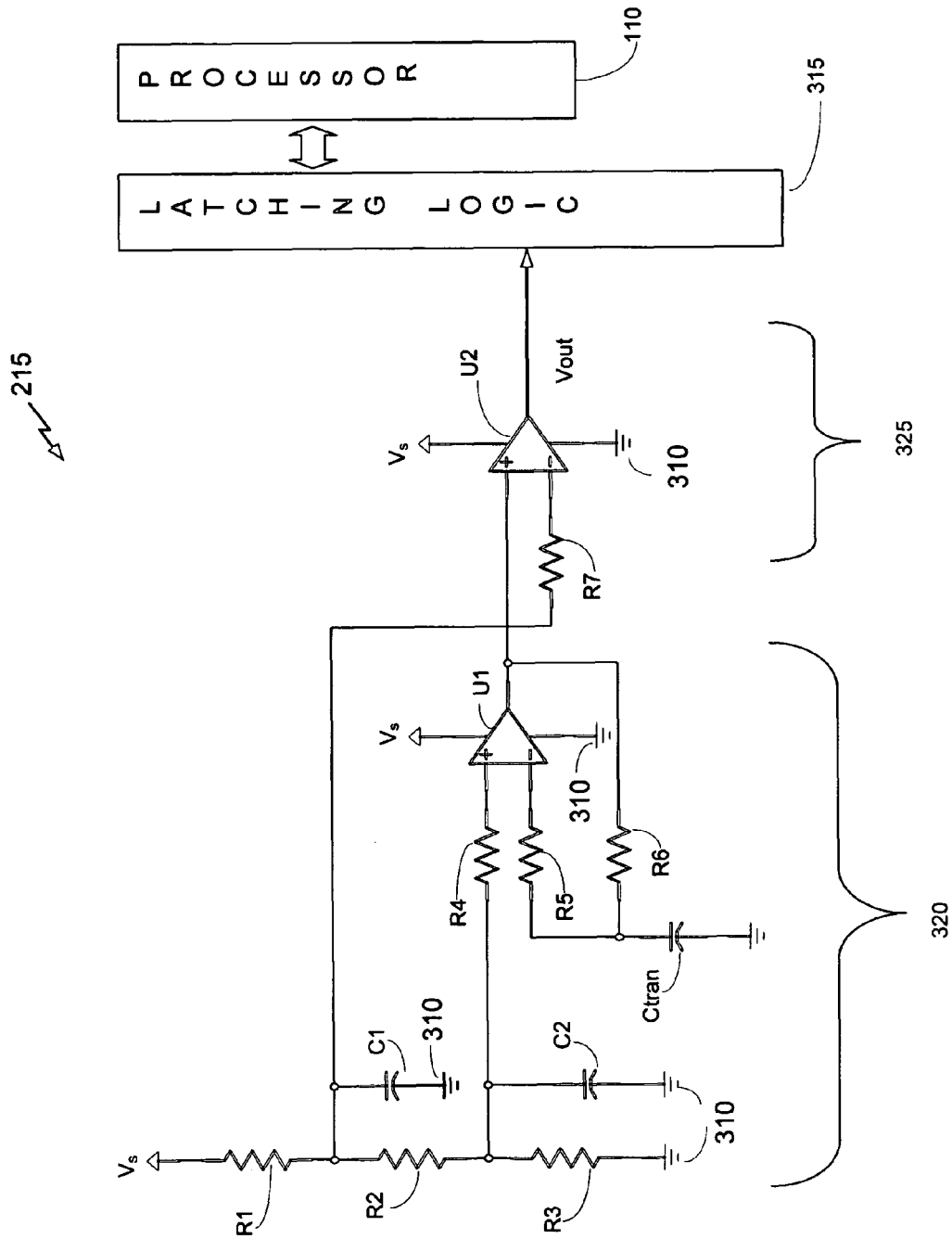
FIG. 3 displays a tampering detection circuit in accordance with another embodiment of the present invention.

FIG. 3 displays a more detailed view of an exemplary tamper alarm circuit 215 in accordance with one embodiment of the present invention. The tamper alarm circuit 215 is composed of an amplification stage 320 and a comparator stage 325. The amplification stage amplifies a voltage generated by a transducer which in this embodiment is ceramic capacitor $C_{tran}$. Those skilled in the art appreciate that the transducer may include but not be limited to any piezoelectric device that converts mechanical movement into energy. The transducer voltage may be generated by vibrations experienced by the transducer (capacitor $C_{tran}$). The comparator stage 325 then monitors the output of the amplification stage 320 and determines when the voltage from the amplification stage 320 reaches a predetermined threshold.

Within the amplification stage 320 is an inverting amplifier U1. The negative terminal of the amplifier U1 is connected to $R_5$ which is in turn connected to the capacitor $C_{tran}$. The other side of the capacitor $C_{tran}$ is connected to ground. The gain of the amplifier U1 with respect to the piezoelectric voltage $V_{tran}$ developed by the capacitor $C_{tran}$ is determined by the resistance of $R_6$ and the reactance of $C_{tran}$ (also referred to as $X_{tran}$ in the formula below) as given by:

$$\frac{V_O}{V_{tran}} = -\frac{R_6}{X_{tran}}$$

Since $X_{tran}$ decreases with increasing frequency, the circuit gain correspondingly increases with frequency. A maximum is achieved at the frequency where the value of the gain expression and the amplifiers open loop gain are equal. At higher frequencies the circuit gain decreases with the amplifier's open loop characteristics. In one exemplary embodiment, the value for $R_6$ is 1.0 MΩ and $C_{tran}$ is 220 nF. With these values, and a typical low cost operational amplifier gain-bandwidth product of 100,000, the maximum gain is approximately 1000 at about 85 Hz. Therefore, a 1 mVAC voltage signal generated by the capacitor $C_{tran}$ will result in about a 1.0 VAC output signal at 85 Hz from the output of the amplifier U1

Within the amplification stage 320 are resistors $R_1$, $R_2$ and $R_3$ which form a voltage divider that provides a DC bias to the voltage generated by the capacitor $C_{tran}$ as well as provides a threshold voltage used by the comparator stage 325. More specifically the total voltage drop across resistors R2 and R3 is used to determine the threshold of the comparator U2 within the comparator stage 325 and the voltage drop across resistor R3 provides the DC bias for the amplifier U1. Adding the DC bias for amplifier U1 improves the transducer gain of the capacitor $C_{tran}$. In one embodiment, resistors $R_1$, $R_2$ and $R_3$ may be 232 kΩ, 20 kΩ, and 200 kΩ respectively. Using these resistive values, and assuming a voltage source Vs of 5 volts DC, the bias applied to the input side of the amplified U1 is about 2.2 VDC. In this configuration, the amplified signal generated from the capacitor $C_{tran}$ will be an AC component on top of the 2.0 VDC bias. Correspondingly, the sum of the voltage drops across resistors $R_2$ and $R_3$ is about 2.4 VDC and is used for the threshold to determine if the voltage signal produced by the amplifier $U_1$ is at or above a predetermined threshold. The predetermined threshold may correspond to a tampering alarm condition. Additionally, capacitors $C_1$ and $C_2$ provide filtering for noise components, while resistors $R_4$ and $R_5$ provide a buffer to limit the amount of current that may flow through the amplifier U1. In one embodiment the capacitors $C_1$ and $C_2$ may be 100 nF capacitors and resistors $R_4$ and $R_5$ may be 4.7 kΩ resistors.

In an exemplary embodiment, Capacitor $C_{tran}$ may use barium titanate as a principal dielectric constituent. In this embodiment, the capacitor $C_{tran}$ may range from 0.2 µF up to 1.0 µF and may have dielectric characteristics of Y5V or Z5U. Those skilled in the art appreciate that capacitors with dielectric characteristics similar to those previously mentioned typically exhibit the most prominent piezoelectric characteristics within the family of ceramic capacitors and are among the least expensive types. The piezoelectric properties (also may be referred to as micro-phonic properties) of capacitor $C_{tran}$ allow the capacitor $C_{tran}$ to function as a transducer converting mechanical strain into electrical signals. Embodiments of the present invention take advantage of the piezoelectric capabilities of ceramic capacitors having barium titanate as a principal dielectric constituent. However, those skilled in the art appreciate that capacitors using a different dielectric constituent other than barium titanate may exhibit similar piezoelectric properties and may therefore function as a suitable transducer.

Any vibration imparting strain to the capacitor $C_{tran}$ may result in an AC signal being generated by the capacitor $C_{tran}$. The generated signal is directed into the input of the amplifier $U_1$. The generated signal is amplified as previously described and the output of the amplifier $U_1$ is directed to the positive input of comparator $U_2$. Comparator $U_2$ receives the amplified signal (the output of U1) and compares the amplified signal to a predetermined voltage threshold present at the negative input. When the amplified voltage exceeds the predetermined threshold, the output of the comparator U2 is driven high and reaches the supply voltage $V_s$. As displayed in FIG. 3, the output of the comparator U2 may be directed to latching logic 315. In one embodiment, the latching logic 315 may be a single flip-flop designed to clock in a logic "1" when the output of the comparator U2 is driven high. In this embodiment, the flip-flop is reset after being read by the processor 110. In an alternative embodiment, the latching logic 315 may be a series of flip-flops or possibly a counter that records the number of times the comparator $U_2$ output is driven high. The processor 110 may read the flip-flops or counter in order to determine how many times the predetermined threshold was met or exceeded over a certain period of time. In this embodiment, the flip-flops or counter may also be reset after the processor 110 has read them.

Figure 4:
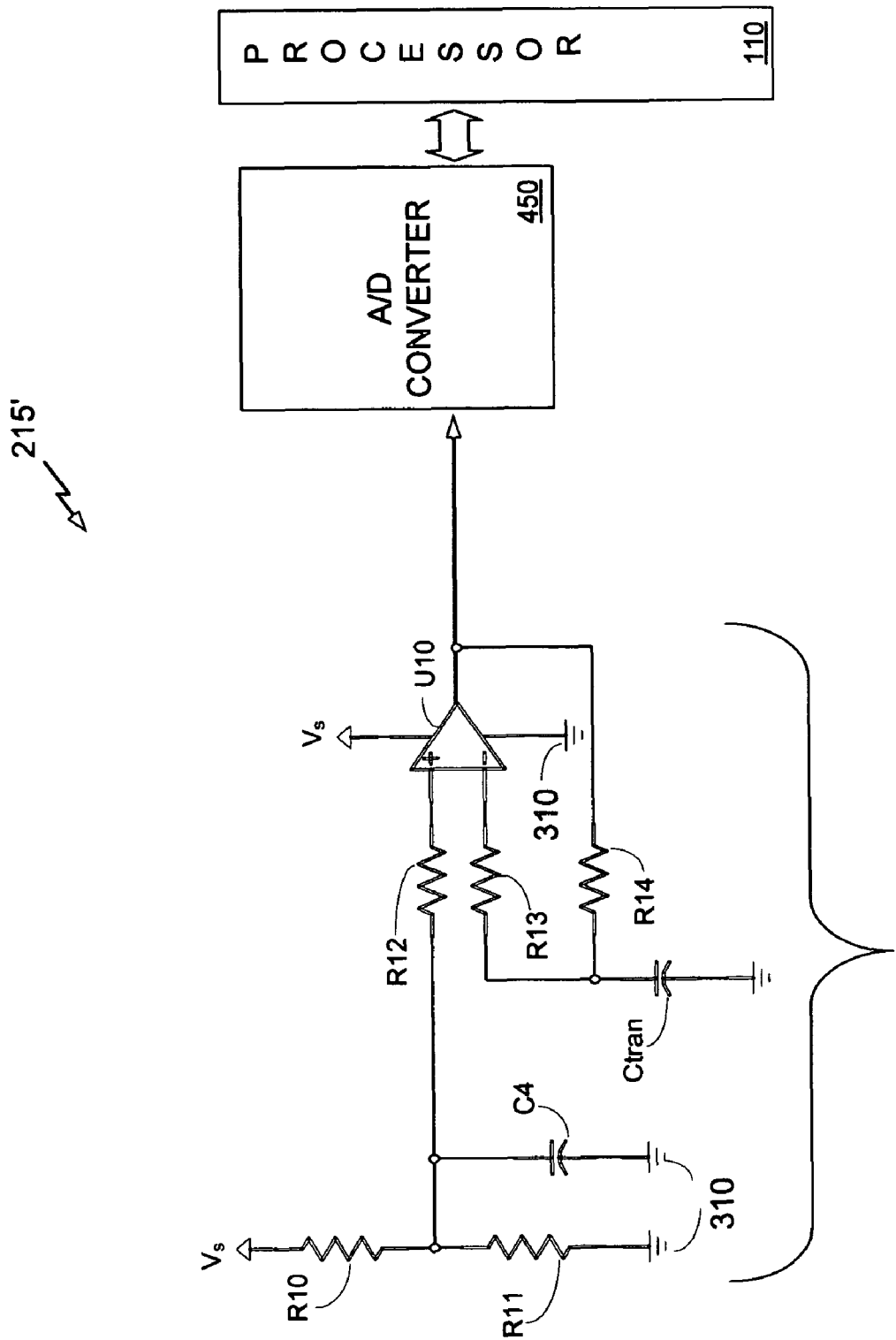
FIG. 4 shows an alternate tampering detection circuit in accordance with another embodiment of the present invention.

FIG. 4 displays another exemplary tamper alarm circuit 215' in accordance with an alternative embodiment of the present invention. The tamper alarm circuit 215' has an amplification stage 420 connected to an analog to digital (A/D) converter 450. The output of the A/D converter is then sent to the processor 110. Similar to the amplifier U1 in FIG. 3, amplifier U10 amplifies the voltage signal generated by the capacitive transducer $C_{tran}$. The gain associated with the amplification of the generated AC signal with respect to the piezoelectric voltage $V_{tran}$ developed by $C_{tran}$ is determined by the resistor $R_{14}$, the reactance of $C_{tran}$ and the open loop characteristics of amplifier U10, similar to amplifier U1 in FIG. 3. In one exemplary embodiment, the resistor $R_{14}$ may be a 1 MΩ resistor. Similar to the voltage divider of FIG. 3, the voltage divider consisting of resistors $R_{10}$ and $R_{11}$ provide a DC bias for the output of the amplifier U10. In one embodiment, the values for resistors $R_{10}$ and $R_{11}$ may both be 233 kΩ. Capacitor $C_4$ provides noise filtering while resistors $R_{12}$ and $R_{13}$ limit the amount of current that may flow through the amplifier U10 when the voltage supply $V_s$ is removed and capacitor $C_4$ discharges. In yet other alternative embodiments, the A/D converter 450 as well as amplification stage 420 may be performed by circuitry already contained within the processor 110.

Figure 5:
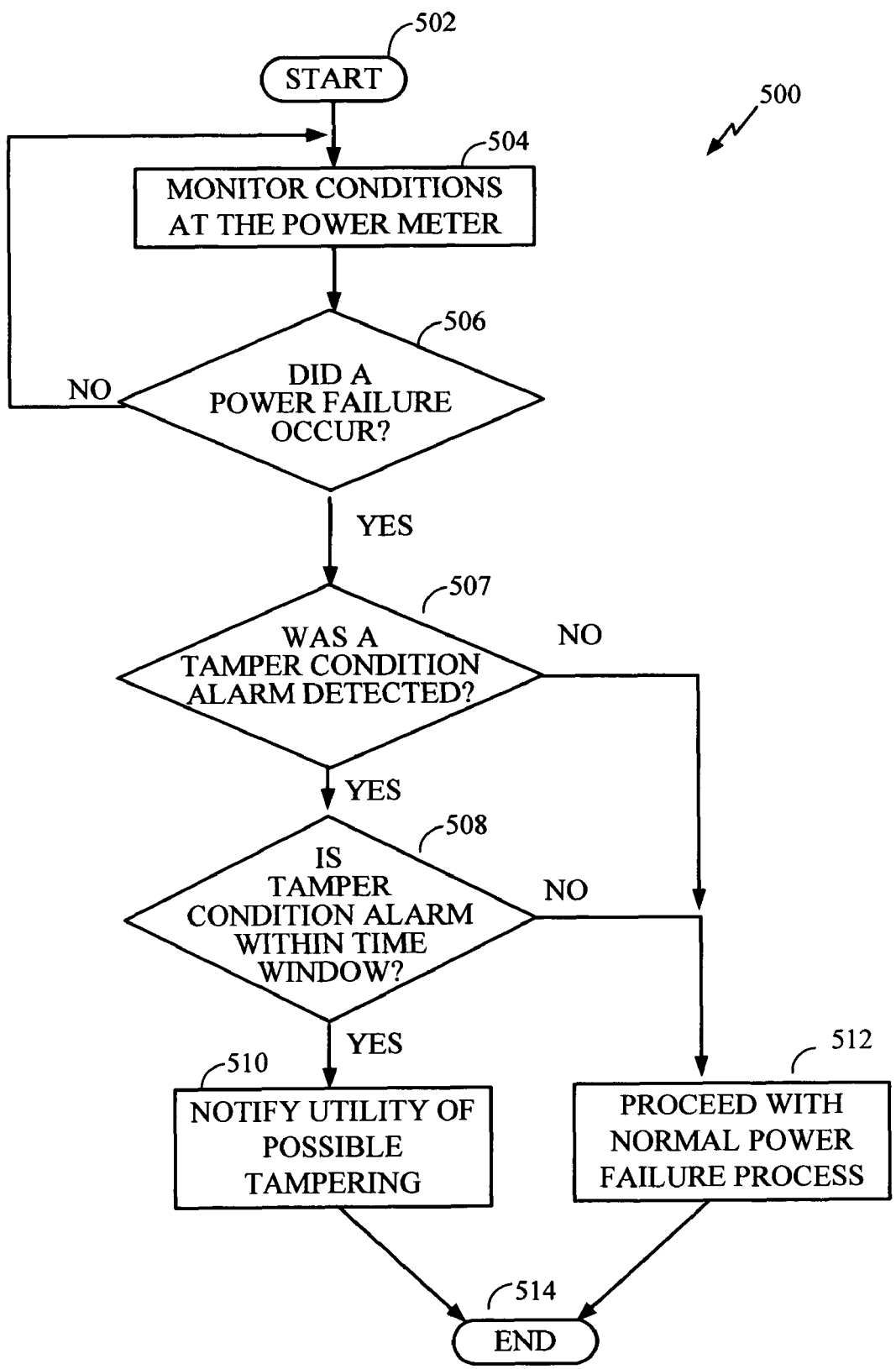
FIG. 5 displays a flow chart describing the processing of an electrical power meter using the detection circuitry of FIG. 3 or FIG. 4 in accordance with one embodiment of the present invention.

FIG. 5 displays a process flow 500 outlining steps the processor 110 may take in order to determine if a tamper alarm condition has occurred in the watt-hour meter 200 in accordance with one embodiment of the present invention. The process flow 500 begins at start block and proceeds to block 504. At block 504, the processor 110 monitors the conditions at the watt-hour meter 200. As displayed in FIG. 2, the processor 110 may utilize the power failure detection circuit 230 to monitor the power conditions at the source side 160 of the watt-hour meter 200.

The process flow 500 continues on from block 504 to decision block 506. At decision block 506, the processor 110 determines if a power failure has occurred. If a power failure has not occurred, the process flow 500 continues back to block 504. If at decision block 506 a power failure has occurred, the process flow 500 continues on to decision block 507. In the event of a power failure, the processor 110 may receive a power failure indication from the power failure detection circuit 230. Even though a power failure may have occurred, the processor 110 may continue to operate if it receives power from an alternate power supply such as a battery, large discharging capacitor or the like. In this embodiment, the processor 110 may continue to operate and process the conditions at the watt-hour meter 200.

At decision block 507, the processor 110 determines if the tamper alarm circuit 215 has detected a tamper alarm condition. As discussed previously, the tamper alarm circuit 215 may generate a tamper alarm condition due to vibrations sensed by the capacitive transducer $C_{tran}$. If at decision block 507 the processor 110 has determined that a tamper alarm condition exists, the process flow 500 proceeds to decision block 508. If no tamper alarm condition is detected, the process flow continues on to block 512. The tamper alarm circuit 215 may generate the tamper alarm condition if the conditions previously mentioned occurred either prior to or shortly after the power failure. This is described in further detail in the discussions of block 508.

At decision block 508, the processor 110 determines if the tamper condition alarm has been generated within a predetermined period of time either preceding or following a power failure indication. As discussed previously, the tamper condition alarm may be the latched output of the latching logic 315 as shown in FIG. 3. In an alternate embodiment the tamper condition alarm may be the digital output of the A/D converter 450 as shown in FIG. 4. If the tamper condition alarm is within the predetermined period of time, the processor 110 proceeds on to block 510. If the transducer signal is not within the predetermined period of time, the process flow continues on to block 512. At block 512, the processor 110 continues with shutting the watt-hour meter 200 down as per a predetermined power failure process. After the processor 110 finishes processing the normal power failure at block 512, the process flow 500 ends at block 514.

If at block 508, the processor 110 determines that the tamper condition alarm has occurred with the predetermined period of time, the processor 110 may take the appropriate steps of notifying the utility company of the possible tampering condition as shown at block 510. In one embodiment, the processor 110 may communicate this information directly to the utility company via the communication module 105 (FIG. 2). This communication may be performed over cellular communications, two way radio communications or the like. Alternatively, the processor 110 may activate a colored LED on the watt-hour meter 200. For example, the processor 110 may illuminate a red LED on the faceplate of the watt-hour meter 200 allowing the utility craftsperson an easy way of identifying any meter that may have been tampered with. In this embodiment, the processor 110 may continue to illuminate the colored LED until the utility company instructs the processor 110 to reset its tamper condition alarm. In an alternative embodiment, an alert icon and a code number may be displayed on the LCD display of the watt-hour meter 200. In yet another alternate embodiment, the processor 110 may activate an auditory response such as an audible alarm.

After the processor 110 has conveyed the tampering condition alarm to the utility company, the tamper condition alarm may be reset several different ways. In one embodiment, the processor 110 may require the crafts person to physically depress a particular switch on the watt-hour meter 200. Alternatively, the processor may keep the tampering condition active until instructed via commands sent by the utility company to reset the condition. In yet another alternate embodiment, the processor 110 may reset itself after another predetermined amount of time. After the processor has processed the tamper condition alarm at block 510, the process flow 500 ends at block 514.

Figure 6:
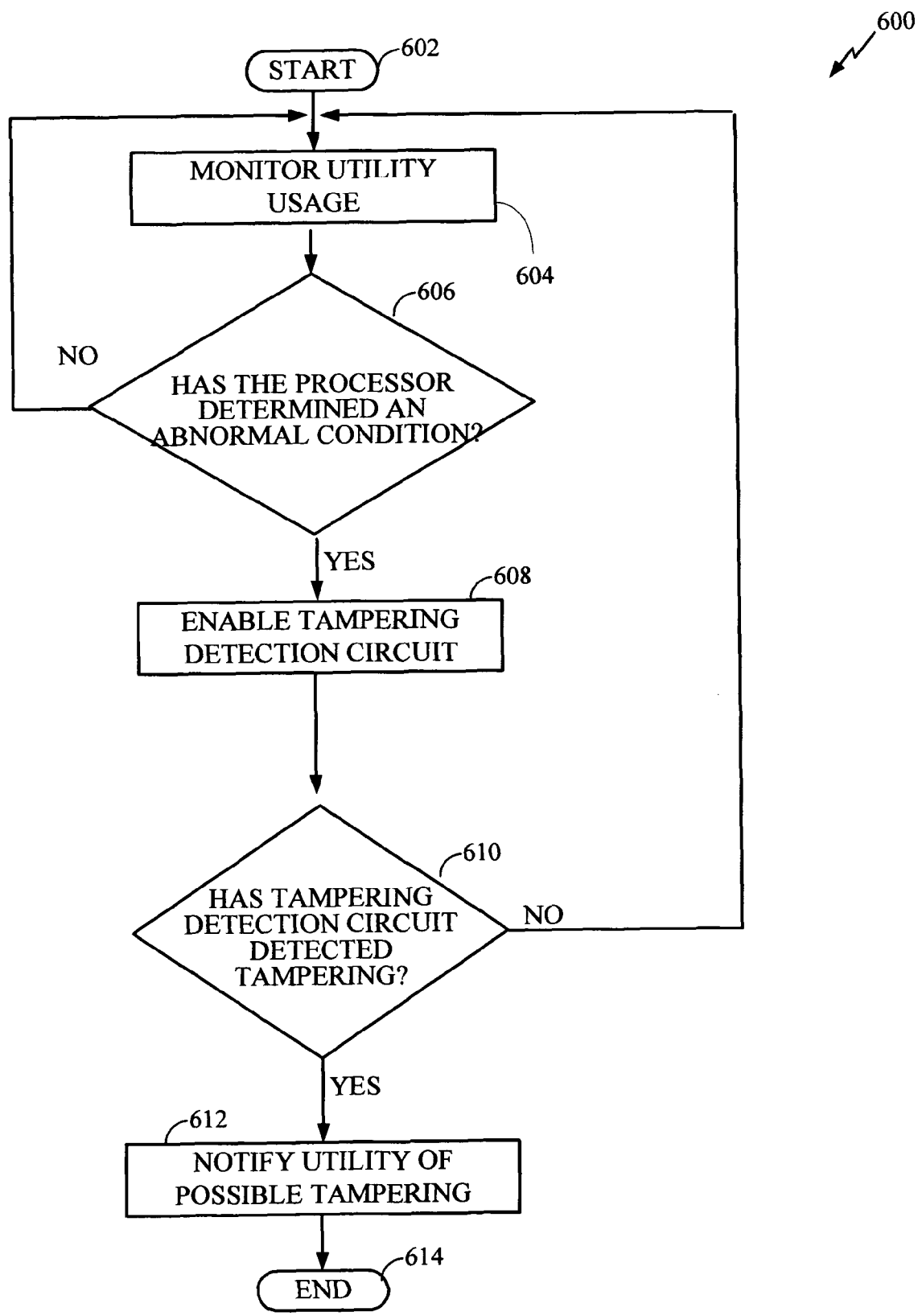
FIG. 6 displays a flow chart describing the processing of a water or gas utility meter using the detection circuitry of FIG. 3 or FIG. 4 in accordance with another embodiment of the present invention.

FIG. 6 displays a process flow 600 in accordance with another embodiment of the present invention. The process flow 600 may apply to other types of utility meters such as water meters or gas meters which may utilize a tamper alarm circuit 215 as shown in FIG. 3. The first step in the process flow 600 begins at block 602. The process flow 600 proceeds to block 604. At block 604, the processor 110 may monitor the utility usage. As the processor 110 monitors the utility usage, the processor 110 typically monitors the conditions for any type of abnormality. Any condition that the utility company deems to be uncommon or unexpected may be considered abnormal for purposes of this example. From block 604, the process flow 600 continues to decision block 606.

At decision block 606, the processor 110 may make the determination that an abnormal condition has occurred. If an abnormal condition has occurred, the process flow 600 continues to block 608. At block 608, the processor 110 may enable the tamper alarm circuit 215. In one exemplary embodiment, the utility meter 100 may not have a constant and almost unlimited power source as is available in a power meter. In order to conserve power, the tamper alarm circuit 215 may only be turned on when an abnormal condition has been detected. Turning the tamper alarm circuit 215 on only when needed, the processor 110 may conserve operating power.

The process flow 600 proceeds from block 608 to decision block 610. At decision block 610, the processor 110 makes the determination if the tamper alarm circuit 215 has detected a tamper condition alarm. If a tamper condition alarm has been detected, the processor 110 notifies the utility company of the tamper condition alarm at block 612 and the process flow 600 ends at block 614. If the tamper alarm circuit 115 has not detected any tampering, the process flow 600 returns to block 604, and the processor 110 continues to monitor the utility usage.

At block 612, the processor 110 may communicate the possible tampering condition directly to the utility company via the communication module 105 (FIG. 1). This may be done over cellular communications, two way radio communications or the like. Alternatively, the processor 110 may activate a colored LED on the utility meter 100. For example, the processor 110 may illuminate a red LED on the faceplate of the utility meter 100 allowing the utility craftsperson an easy way of identifying any meter that may have been tampered with. In an alternative embodiment, an alert icon and a code number may be displayed on the LCD display of the watt-hour meter 200. In yet another alternate embodiment, the processor 110 may activate an auditory response such as an alarm.

In another exemplary embodiment, the tamper alarm circuit 215 or 215' may be installed in a gas meter or a water meter that may have enough power to allow the tamper alarm circuit 215 or 215' to receive continuous power. In this embodiment, the tamper alarm circuit 215 or 215' may be used to determine the abnormal condition as described at block 606 of FIG. 6. Receiving power continuously allows the processor to use the tamper alarm circuit 215 or 215' to continuously monitor the conditions at the utility meter for tampering.

It should be noted that upon the report of a possible tamper condition alarm, the utility company may perform one of several different responses. For example, if a large truck should pass near a water meter, the tamper alarm circuit 215 may determine a possible tampering condition has occurred due to the vibrations induced by the truck. In this instance, the utility company may continue to monitor the particular utility meter 100 to see if the meter is still operating normally. If the utility meter is still operating normally, the utility company may simply reset the tamper condition alarm at the water meter. Alternatively, if the utility company receives tamper condition alarms from several utility meters 100 within a close proximity of each other, the utility company may continue monitoring the meters in question to determine if there has been an event that does not correspond to tampering such as a thunderstorm, hail storm, sonic boom or other type of event not corresponding to a possible tampering condition.

Additionally, the tamper alarm circuit 215 may be designed to be more or less sensitive to vibrations by adjusting the gain of the amplifier U1 (FIG. 3). Thus, if a water meter is always installed underground it may be more susceptible to vibrations from sources other than tampering and the gain may be reduced. Reducing the gain makes the tampering detection circuit 300 less sensitive to vibrations.

The various illustrative logical blocks, modules, circuits, elements, and/or components described in connection with the embodiments disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing components, e.g., a combination of a DSP and a microprocessor, a plurality of microprocessors, one or more microprocessors in conjunction with a DSP core, or any other such configuration.

Although specific embodiments have been illustrated and described herein, those of ordinary skill in the art appreciate that any arrangement, which is calculated to achieve the same purpose, may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A tamper alarm circuit for detecting a tampered condition of a utility meter comprising:
    an amplification stage comprising:
    a transducer that generates a transducer output responsive to physical movement of the utility meter; and
    an amplification circuit that receives and amplifies the transducer output, and generates an amplified output;
    and a comparator stage comprising a comparator that receives the amplified output, compares the amplified output to a predetermined threshold that corresponds to a tampering condition, and provides a comparator output when the amplified output exceeds the predetermined threshold,
    wherein an alarm condition is generated when the comparator output indicates that the amplified output exceeds the predetermined threshold.

2. The tamper alarm circuit of claim 1 wherein the utility meter is a watt-hour meter.

3. The tamper alarm circuit of claim 1 wherein the transducer is a piezoelectric transducer ceramic capacitor.

4. The tamper alarm circuit of claim 3 wherein the piezoelectric transducer is a ceramic capacitor.

5. The tamper alarm circuit of claim 1 wherein the utility meter is a gas meter.

6. The tamper alarm circuit of claim 1 wherein the utility meter is a water meter.

7. A utility meter comprising:
    a utility resource monitoring circuit, the utility resource monitoring circuit monitoring the amount of resources used by a consumer, the utility resource monitoring circuit communicating with;
    a tamper alarm circuit, the tamper alarm circuit further comprising
    an amplification stage that generates an amplified voltage signal responsive to physical movement of the utility meter; and
    a comparator stage that receives the amplified voltage signal, compares the amplified voltage to a predetermined threshold, and generates an indication that the amplified voltage signal has exceeded the predetermined threshold.

8. The utility meter of claim 7 wherein an alarm condition is generated if it is determined that the voltage signal exceeded the predetermined threshold within a predetermined time window of a power failure of the utility meter.

9. The utility meter of claim 8 wherein the predetermined time window is before or after the power failure.

10. The utility meter of claim 7 wherein the utility meter is a watt-hour meter.

11. The utility meter of claim 7 wherein the utility meter is a gas meter.

12. The utility meter of claim 7 wherein the transducer is a piezoelectric transducer.

13. The utility meter of claim 12 wherein the piezoelectric transducer is a ceramic capacitor.

14. A method for detecting a tamper condition in a utility meter comprising, the utility meter having a transducer coupled to an amplification circuit, the method comprising:
    receiving a voltage signal from the transducer in response to physical movement of the utility meter;
    amplifying the voltage signal from the transducer at the amplification circuit so as to generate an amplified voltage signal;
    determining that the amplified voltage signal has exceeded a predetermined threshold, and
    generating an alarm condition when it is determined that the amplified voltage signal has exceeded the predetermined threshold.

15. The method of claim 14 wherein the determining step occurs within a predetermined time window after the utility meter has detected a power failure.

16. The method of claim 14 wherein the determining step occurs within a predetermined time window before the utility meter has detected a power failure.

17. The method of claim 14 wherein the utility meter is a watt-hour meter.

18. The method of claim 14 wherein the utility meter is a water meter.

19. The method of claim 14 wherein the transducer is a piezoelectric transducer.

20. The method of claim 19 wherein the piezoelectric transducer is a ceramic capacitor.

21. The utility meter of claim 9, further comprising a power failure detection circuit that provides an indication that the power failure has occurred, and a processor that receives the indication that the amplified voltage signal has exceeded the predetermined threshold, and further receives the indication that that the power failure has occurred, and generates the alarm condition when the power failure is within the predetermined time window.

22. The method of claim 14, further comprising the step of identifying that the utility meter has detected a power failure, wherein the generating step occurs within a predetermined time window of the detected power failure.

23. The method of claim 18, wherein the time window is before or after the power failure.

* * * * *